(12) United States Patent
Jang et al.

(10) Patent No.: US 10,062,739 B2
(45) Date of Patent: Aug. 28, 2018

(54) FLEXIBLE DISPLAY DEVICE

(71) Applicant: Samsung Display Co., Ltd., Yongin-si (KR)

(72) Inventors: Hyoungwook Jang, Anyang-si (KR); Jeonghoon Bang, Bucheon-si (KR); Soonsung Ahn, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 233 days.

(21) Appl. No.: 14/950,341

(22) Filed: Nov. 24, 2015

(65) Prior Publication Data
US 2016/0266691 A1    Sep. 15, 2016

(30) Foreign Application Priority Data

Mar. 10, 2015   (KR) .......................... 10-2015-0033355

(51) Int. Cl.
*H01L 27/32*   (2006.01)
*G06F 3/044*   (2006.01)

(52) U.S. Cl.
CPC ............ *H01L 27/323* (2013.01); *G06F 3/044* (2013.01); *G06F 2203/04102* (2013.01); *G06F 2203/04111* (2013.01); *G06F 2203/04112* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 7,663,607 B2 | 2/2010 | Hotelling et al. | |
| 8,274,488 B2 | 9/2012 | Bae | |
| 8,830,189 B2 | 9/2014 | Rimon et al. | |
| 8,907,922 B2 | 12/2014 | Liu | |
| 2011/0025639 A1 | 2/2011 | Trend et al. | |
| 2011/0102370 A1* | 5/2011 | Kono | G06F 3/044 345/174 |
| 2014/0118635 A1 | 5/2014 | Yang | |
| 2014/0253495 A1 | 9/2014 | Kang et al. | |

FOREIGN PATENT DOCUMENTS

| | | |
|---|---|---|
| JP | 2014115694 | 6/2014 |
| KR | 101395195 | 12/2013 |
| KR | 1020140040432 | 4/2014 |
| KR | 1020140110270 | 9/2014 |

* cited by examiner

*Primary Examiner* — Gustavo Polo
(74) *Attorney, Agent, or Firm* — H.C. Park & Associates, PLC

(57) ABSTRACT

A flexible display device includes display panel, a touch panel including a touch sensor and a second touch sensor intersecting the first touch sensor, in which the first touch sensor includes first sensor parts, each of the first sensor parts including first conductive lines, and a first crossing part connecting two adjacent first sensor parts, the first crossing part including second conductive lines, and the second touch sensor includes second sensor parts, each of the second sensor parts including third conductive lines, and a second crossing part including fourth conductive lines disposed between the second conductive lines, and a first connection electrode connecting the third conductive lines to the fourth conductive lines and insulated from the second conductive lines.

20 Claims, 15 Drawing Sheets

FLEXIBLE DISPLAY DEVICE

CROSS-REFERENCE TO RELATED APPLICATION

This application claims priority from and the benefit of Korean Patent Application No. 10-2015-0033355, filed on Mar. 10, 2015, which is hereby incorporated by reference for all purposes as if fully set forth herein.

BACKGROUND

Field

Exemplary embodiments of the present invention relate to a flexible device, and more particularly, to a flexible display device including a touch panel.

Discussion of the Background

Various kinds of display devices are being developed for use in multimedia devices, such as televisions, portable phones, tablet computers, navigation units, and gaming machines. Display devices may generally include input units, such as keyboards, mice, and so on.

In addition to traditional flat-type display devices, recent display devices may have improved features, such as flexible display devices that may include curved, bendable, foldable, rollable, and stretchable display devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device including a touch panel with smaller defects.

Additional aspects will be set forth in the detailed description which follows, and, in part, will be apparent from the disclosure, or may be learned by practice of the inventive concept.

According to an exemplary embodiment of the present invention, a flexible display device includes display panel, a touch panel including a touch sensor and a second touch sensor intersecting the first touch sensor, in which the first touch sensor includes first sensor parts, each of the first sensor parts including first conductive lines, and a first crossing part connecting two adjacent first sensor parts, the first crossing part including second conductive lines, and the second touch sensor includes second sensor parts, each of the second sensor parts including third conductive lines, and a second crossing part including fourth conductive lines disposed between the second conductive lines, and a first connection electrode connecting the third conductive lines to the fourth conductive lines and insulated from the second conductive lines.

The first conductive lines, the second conductive lines, the third conductive lines, and the fourth conductive lines may be directly disposed on a first layer, and the first connection electrode may be disposed on a second layer different from the first.

The first sensor parts may be disposed along a first direction axis, the second conductive lines may extend along the first direction axis, and the second sensor parts may be disposed along a second direction axis intersecting the first direction axis.

The fourth conductive lines may be spaced apart from the second conductive lines and extend along the first direction axis.

The fourth conductive lines may be isolated from the second conductive lines, and a portion of the fourth conductive lines may be disposed in the first direction axis along with one of the second conductive lines.

The first conductive lines, the second conductive lines, the third conductive lines, and the fourth conductive lines may be disposed on the same base surface.

The touch panel further may include an insulation layer disposed on the base surface and covering the first conductive lines, the second conductive lines, the third conductive lines, and the fourth conductive lines, and the first connection electrode may be disposed on the insulation layer and may connect the fourth conductive lines to the third conductive lines through contact holes that penetrate the insulation layer.

Each of the first sensor parts may have a mesh shape connecting the first conductive lines to each other, and each of the second sensor parts may have a mesh shape connecting the third conductive lines to each other.

Each of the first conductive lines and the third conductive lines may have a line width less than 10 μm.

The second crossing part may further include a second connection electrode connecting the third conductive lines to each other and the second connection electrode may be disposed on the same layer with the first connection electrodes.

The second crossing part may further include a third connection electrode connecting the fourth conductive lines to each other and the third connection electrode may be disposed on the same layer with the first connection electrodes.

Each of the first conductive lines, the second conductive lines, and the third conductive lines may include a transparent conductive oxide (TCO).

The touch panel may further include a base member including the base surface, and the touch panel may be connected to the display panel.

The display panel may include the base surface.

The display panel may include a base member, a circuit layer disposed on a side of the base member, an organic light emitting element layer disposed on the circuit layer, an encapsulation layer covering the organic light emitting element layer and including the base surface.

The flexible display device may further include a window member disposed on the touch panel.

The flexible display device may further include a first display area, a second display area, and a folding area disposed between the first display area and the second display area.

According to an exemplary embodiment of the present invention, a flexible display device includes a display panel configured to generate an image, and a touch panel including a first touch sensor and a second touch sensor, in which the first touch sensor includes first sensor parts, each of the first sensor part including first conductive lines connected to each other to form a mesh shape, and a first crossing part connecting two adjacent two first sensor parts, the first crossing part including second conductive lines, and the second touch sensor includes second sensor parts, each of the second sensor part including third conductive lines connected to each other to form a mesh shape, and a second crossing part including connection lines disposed between the second conductive lines, and a connection electrode connecting the third conductive lines to the connection lines and insulated from the second conductive lines.

According to an exemplary embodiment of the present invention, a method of forming a touch panel of a flexible display device includes forming a first touch sensor including first sensor parts and a first crossing part, and forming a second touch sensor including second sensor parts and a second crossing part, in which forming the first sensor parts includes connecting first conductive lines with each other in a mesh shape, forming the first crossing part includes connecting second conductive lines with each other in the mesh shape, to connect two adjacent first sensor parts, forming the second sensor parts includes connecting third conductive lines with each other in the mesh shape, forming the second crossing part includes partially disconnecting the second conductive lines in the mesh shape such that the disconnected second conductive lines are spaced apart from the second conductive lines in the mesh shape, and forming a first connection electrode to connect the third conductive lines to the disconnected second conductive lines, and the first, second, and third conductive lines are directly disposed on a first layer, and the first connection electrode is disposed in a second layer different from the first layer.

According to exemplary embodiments of the present invention, since two adjacent sensor parts are electrically connected to each other through conduction lines and connection electrodes, a crossing part may not be damaged from external stress, such as tensile stress or compressive stress, as compared to a crossing part including a single bridge electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
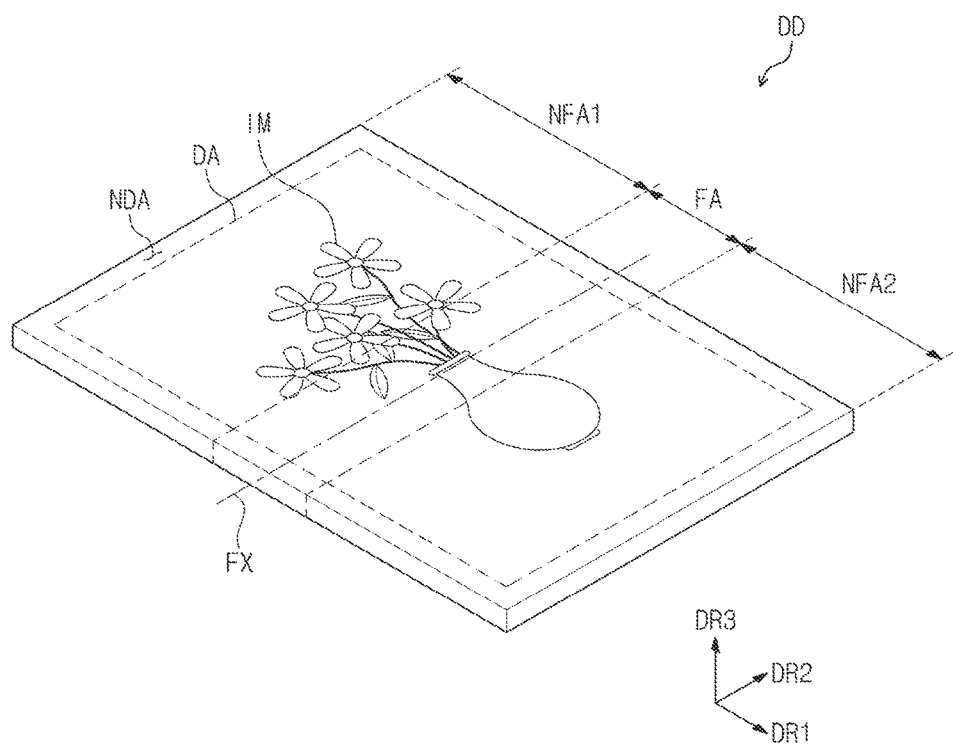
FIGS. 1A and 1B are perspective diagrams illustrating a flexible display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
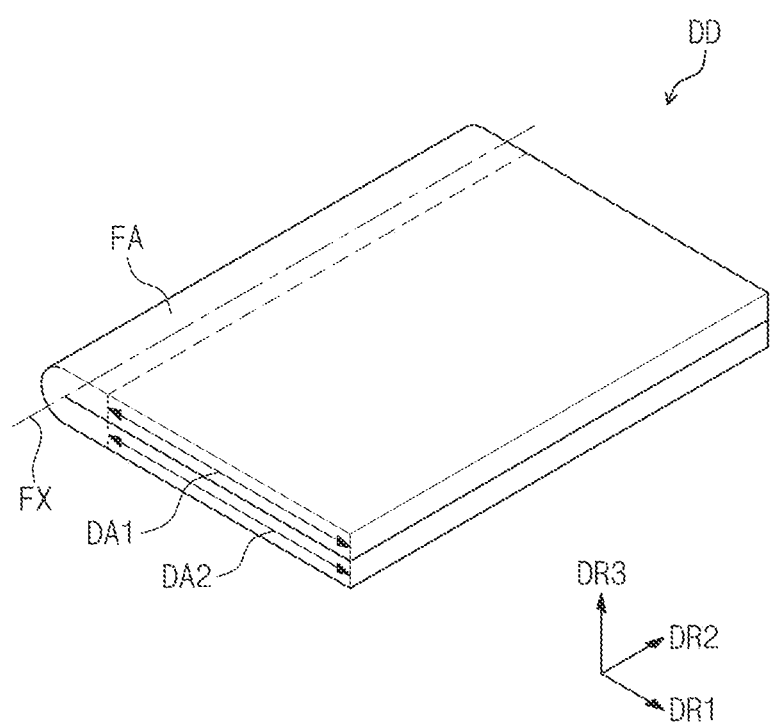

FIGS. 1A and 1B are perspective diagrams illustrating a flexible display device DD according to an exemplary embodiment of the present invention. According to the present exemplary embodiment, the flexible display device DD may be a foldable display unit. According to an exemplary embodiment of the present invention, the flexible display device DD may be a curved, bendable, rollable, and/or stretchable display device. Although not shown, the flexible display device DD may be employed in large-scale electronic devices, such as television sets and exterior advertising panels, and in small and middle-scale electronic devices, such as portable phones, personal computers, laptop computers, personal digital terminals, car navigation units, gaming machines, portable electronic devices, watch-type electronic devices, and cameras.

Referring to FIGS. 1A and 1B, a display plane on which an image IM is displayed may be parallel to a plane defined by a first direction axis DR1 and a second direction axis DR2. A third direction axis DR3 may extend along a thickness direction of the flexible display device DD. The front and rear sides of each member of the flexible display device DD may be defined with respect to the third direction axis DR3. However, directions indicated by the direction axes DR1, DR2, and DR3 may be relative each other and changed in another formation.

As shown in FIGS. 1A and 1B, the flexible display device DD may include multiple areas on the display plane. The flexible display device DD may be divided into a display area DA and a non-display area NDA. The display area DA may be an area on which an image IM is displayed. The non-display area NDA, adjacent to the display area DA, may be an area on which the image IM is not displayed. FIG. 1 illustrates a vase image as an example of the image IM. The display area DA may have a tetragonal shape. The non-display area NDA may surround the display area DA. The flexible display device DD may include a folding area that may be folded along a folding axis FX, and a first non-folding area NFA1 and a second non-folding area NFA2 which may not be folded.

Figure 2A:
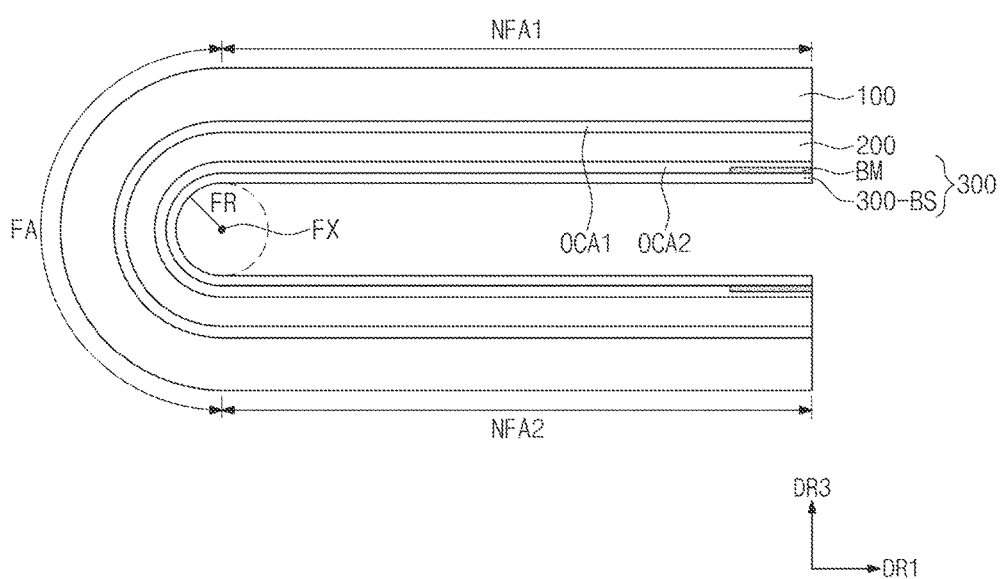
FIGS. 2A and 2B are sectional diagrams illustrating a flexible display device according to an exemplary embodiment of the present invention.
Figure 2B:
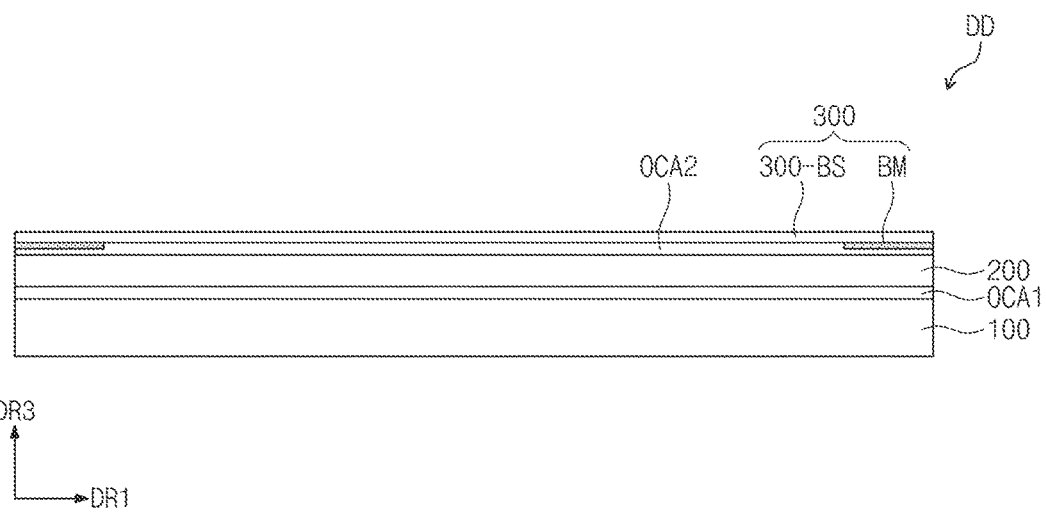

FIGS. 2A and 2B are sectional diagrams illustrating a flexible display device DD according to an exemplary embodiment of the present invention. As shown in FIG. 2A, the flexible display device DD may be folded along the folding axis FX having a folding radius FR, such that a display plane of the first non-folding area NFA1 faces a display plane of the second non-folding area NFA2. Hereinafter, a folding feature that rotates display planes of different areas to face each other (i.e., the display plane of one area is rotated 180° with respect to the display plane of another area) will be referred to as an "inner folding". According to the present exemplary embodiment, as the first non-folding area NFA1 rotates along the folding axis FX in a clockwise direction, a flexible display device DD may be subject to the inner folding. According to an exemplary embodiment of the present invention, the flexible display device DD may be folded along the folding axis FX, such that the display plane of the first non-folding area NFA1 and the display plane of the second non-folding area NFA2 may face toward the outside of the flexible display device DD. Hereinafter, a folding feature that rotates display planes of different areas to face outside will be referred to as an "outer folding".

As shown in FIGS. 2A and 2B, the flexible display device DD may include a display panel 100, a touch panel 200, and a window member 300. The flexible display device DD may further include a protection member (not illustrated) coupled with the window member 300, to protect the display panel 100 and the touch panel 200. The display panel 100, the touch panel 200, and the window member 300 may be flexible.

The display panel 100 may generate an image (IM, see FIG. 1A) corresponding to an input image data. The display panel 100 may be an organic electroluminescent, electrophoretic, or electrowetting display panel. In exemplary embodiments of the present invention, the display panel will be illustrated with reference to an organic electroluminescent display panel, which will be described in detail later.

The touch panel 200 may obtain coordinate information. The touch panel 200 may be disposed on a front side of the display panel 100. The touch panel 200 may be a contactable or non-contactable touch panel. The touch panel 200 will be described in detail later.

The window member 300 may include a third base member 300-BS and a black matrix BM. The black matrix BM may be disposed in the rear side of the third base member 300-BS to define a bezel area, i.e., a non-display area (NDA, see FIG. 1A). The third base member 300-BS may include a glass substrate, a sapphire substrate, and a plastic film. The black mattress BM may be formed of a colored organic layer that may be formed by a coating process. The window member 300 may further include a functional coating layer (not illustrated), which is disposed in the front side of the third base member 300-BS. The functional coating layer may include a fingerprint protecting layer, a reflection protecting layer, a hard coating layer, and so on.

The display panel 100 and the touch panel 200 may be coupled to each other by a first optically clear adhesive film OCA1. The touch panel 200 and the window member 300 may also be coupled with a second optically clear adhesive film OCA2. According to an exemplary embodiment of the present invention, one of the first and second optically clear adhesive films OCA1 and OCA2 may be omitted. For example, the display panel 100 and the touch panel 200 may be fabricated in a successive process to dispose the touch panel 200 directly on the display panel 100.

Figure 3:
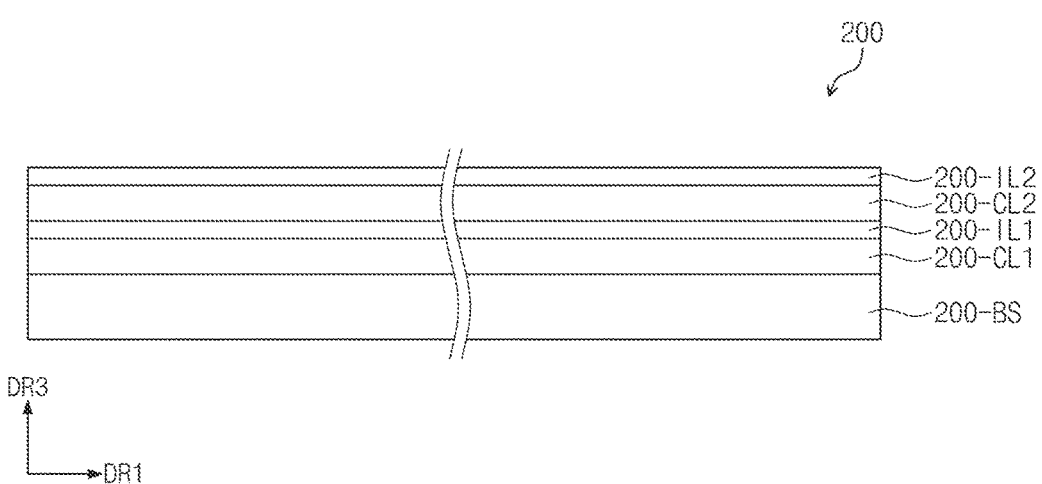
FIG. 3 is a sectional diagram illustrating a touch panel according to an exemplary embodiment of the present invention.
Figure 4:
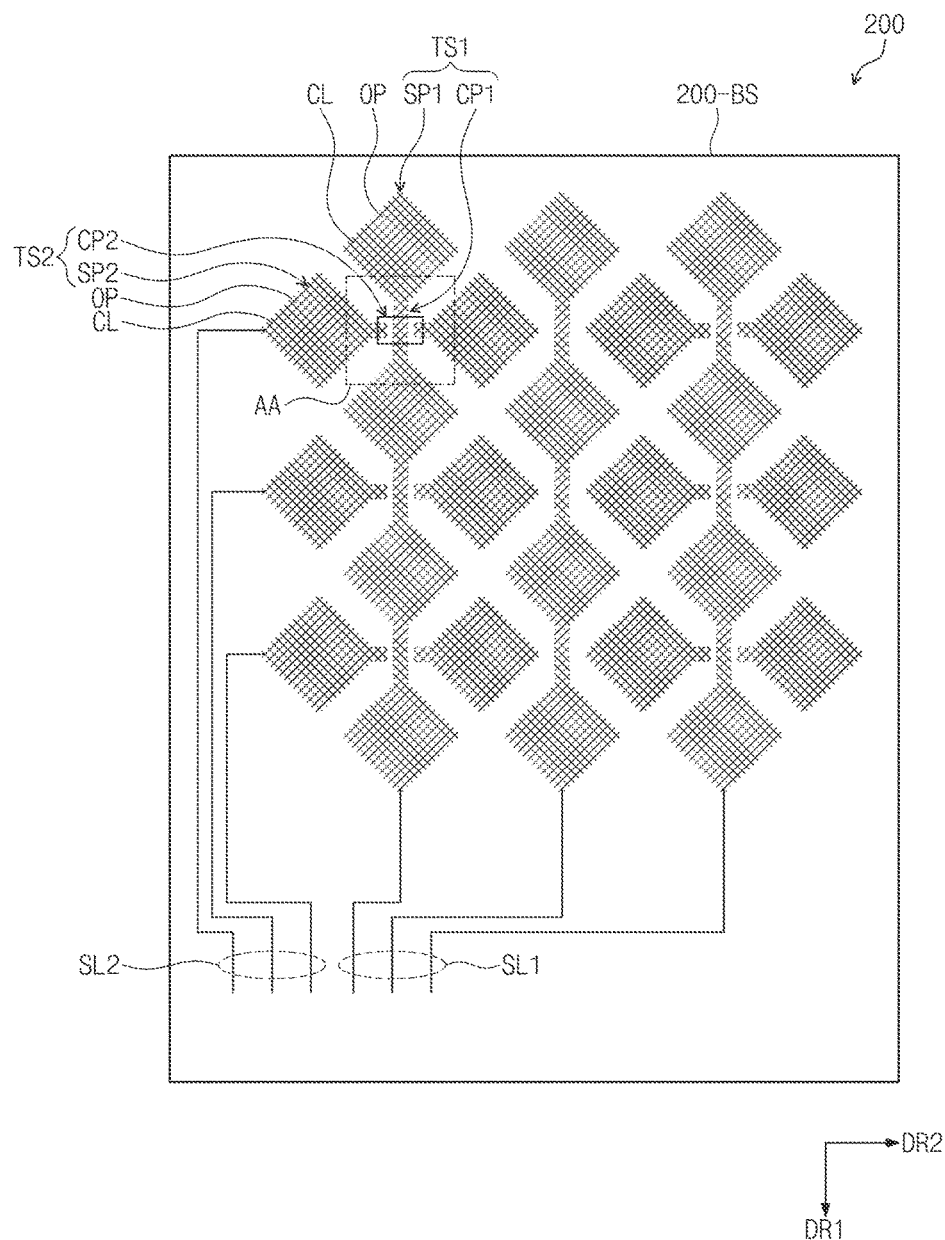
FIG. 4 is a sectional diagram illustrating a touch panel according to an exemplary embodiment of the present invention.

FIG. 3 is a sectional diagram illustrating a touch panel 200 according to an exemplary embodiment of the present invention. FIG. 4 is a sectional diagram illustrating a touch panel 200 according to an exemplary embodiment of the present invention.

Referring to FIG. 3, the touch panel 200 may include a second base member 200-BS, a first conduction layer 200-CL1, a first insulation layer 200-IL1, a second conduction layer 200-CL2, and a second insulation layer 200-IL2. According to the present exemplary embodiment, the first conduction layer 200-CL1, the first insulation layer 200-IL1, the second conduction layer 200-CL2, and the second insulation layer 200-IL2 may be sequentially stacked on the second base member 200-BS.

The touch panel 200 according to the present exemplary embodiment may be a capacitance touch panel. The touch panel 200 may include two types of sensors intersecting each other. The capacitance touch panel may obtain coordinate information of a touched position in a self-capacitance mode or in a mutual-capacitance mode.

The first conduction layer 200-CL1 may contain a transparent conductive oxide, such as indium tin oxide (ITO), indium zinc oxide (IZO), zinc oxide (ZnO), or indium tin zinc oxide (ITZO). The first conduction layer 200-CL1 may contain a metal, such as molybdenum, argentine, titanium, copper, aluminum, or an alloy thereof. The first conduction layer 200-CL1 may contain poly(3,4-ethylenedioxythiophene) (PEDOT), metallic nanowire, or graphene. The first conduction layer 200-CL1 may include a first layer including one of the aforementioned materials, a second layer including one of the aforementioned materials different from that of the first layer, and other layers in addition thereto.

The first conduction layer 200-CL1 may include conduction patterns disposed on a side of the second base member 200-BS. The conduction patterns may include touch sensors and signal lines, which will be described later. The touch sensors and/or signal lines may include conductive lines. The conductive lines may be formed by patterning the first conduction layer 200-CL1 through a photolithography process.

The first insulation layer 200-IL1 may protect the conduction patterns and insulate a portion of the conduction patterns form a portion of other conduction patterns. The first insulation layer 200-IL1 may include an inorganic or organic film. Alternatively, the first insulation layer 200-IL1 may have multiple layers and include at least one inorganic film and at least one organic film.

The second conduction layer 200-CL2 may include a transparent conductive oxide. The second conduction layer 200-CL2 may have a single layer or multiple layers. The second conduction layer 200-CL2 may include conduction patterns. The conductive patterns may include a connection electrode, which will be described later.

The second insulation layer 200-IL2 may protect the second conduction layer 200-CL2. The second insulation layer 200-IL2 may include an inorganic or organic film. Alternatively, the second insulation layer 200-IL2 may have multiple layers and include at least one inorganic film and at least one organic film.

According to an exemplary embodiment of the present invention, the second insulation layer 200-IL2 may be omitted. Alternatively, an arrangement of the first conduction layer 200-CL1 and the second conduction layer 200-CL2 may be shifted with each other.

As shown in FIG. 4, the touch panel 200 may include first touch sensors TS1 and second touch sensors TS2. The first touch sensors TS1 may be extended along a first direction axis DR1 and arranged along a second direction axis DR2. The second touch sensors TS2 may intersect the first touch sensors TS1 in isolation. FIG. 4 illustrates three of the first touch sensors TS1 and three of the second touch sensors TS2. The first touch sensors TS1 and the second touch sensors TS2 may be disposed to substantially overlap a display area (DA, see FIG. 1).

The touch panel 200 may further include signal lines. The signal lines may include first signal lines SL1 and second signal lines SL2. The first signal lines SL1 may be connected respectively to ends of the first touch sensors TS1, and the second signal lines SL2 may be connected respectively to ends of the second touch sensors TS1. The first signal lines SL1 and the second signal lines SL2 are disposed to substantially overlap a non-display area (NDA, see FIG. 1).

The second base member 200-BS may provide a base surface, on which the first touch sensors TS1, the second touch sensors TS2, the first signal lines SL1, and the second signal lines SL2 are disposed.

Each of the first touch sensors TS1 may include first sensor parts SP1 and first crossing parts CP1. The first sensor parts SP1 may be arranged along the first direction axis DR1. Each of the first crossing parts CP1 may connect two adjacent first sensor parts SP1 with each other. FIG. 4 illustrates the first sensor parts SP1 having a rhombus shape and the first crossing parts CP1 having a stripe shape. Alternatively, the first touch sensors TS1 may have a stripe shape that is substantially similar to the shape of the first crossing parts CP1.

The first touch sensors TS1 may have a mesh shape. The first touch sensors TS1 may include conductive lines CL. The conductive lines CL may be connected with each other to define opening parts OP. The first touch sensors TS1 will be described in detail later.

Each of the second touch sensors TS2 may include second sensor parts SP2 and second crossing parts CP2. The second sensor parts SP2 may be arranged along the second direction axis DR2. Each of the second crossing parts CP2 may connect two adjacent second sensor parts SP2 with each other. FIG. 4 illustrates the second sensor parts SP2 having a rhombus shape.

The second touch sensors TS2 may have a mesh shape. The second touch sensors TS2 may include conductive lines CL. The conductive lines CL may be connected with each other to define opening parts OP. The second touch sensors TS2 will be described in detail later.

Figure 5A:
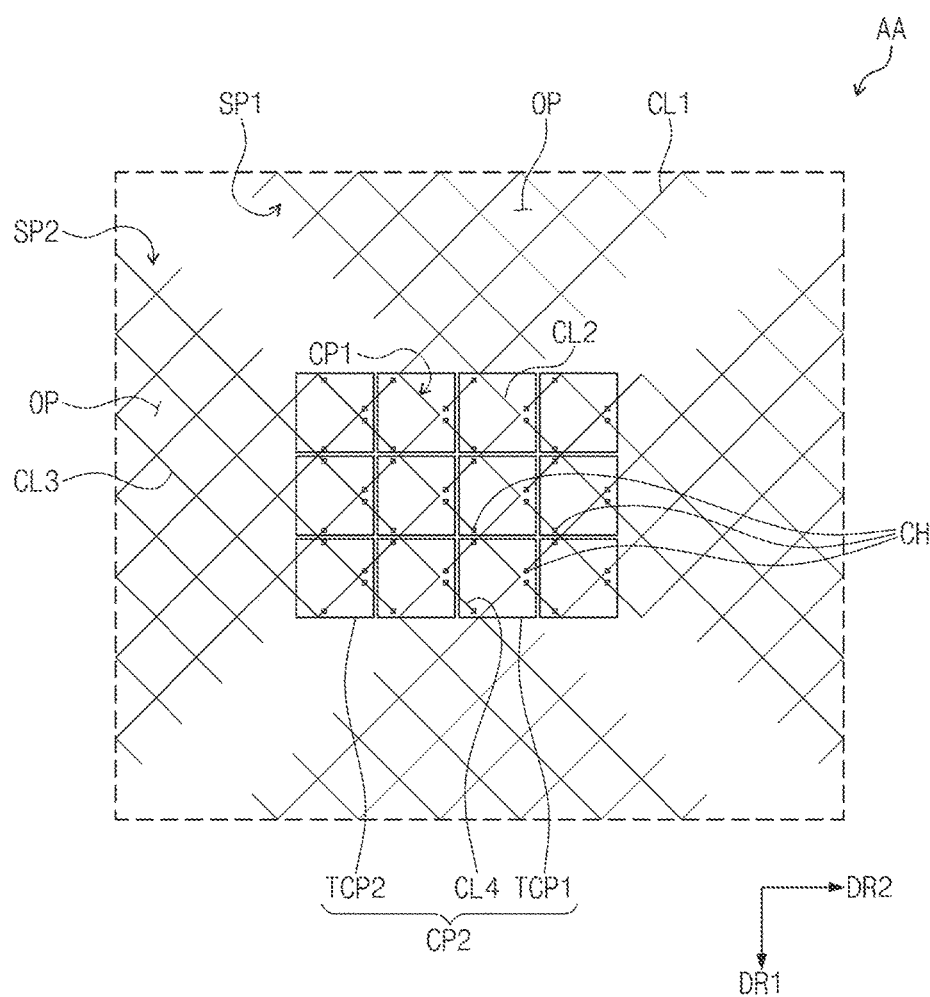
FIG. 5A is a diagram illustrating an area AA of FIG. 4.
Figure 5B:
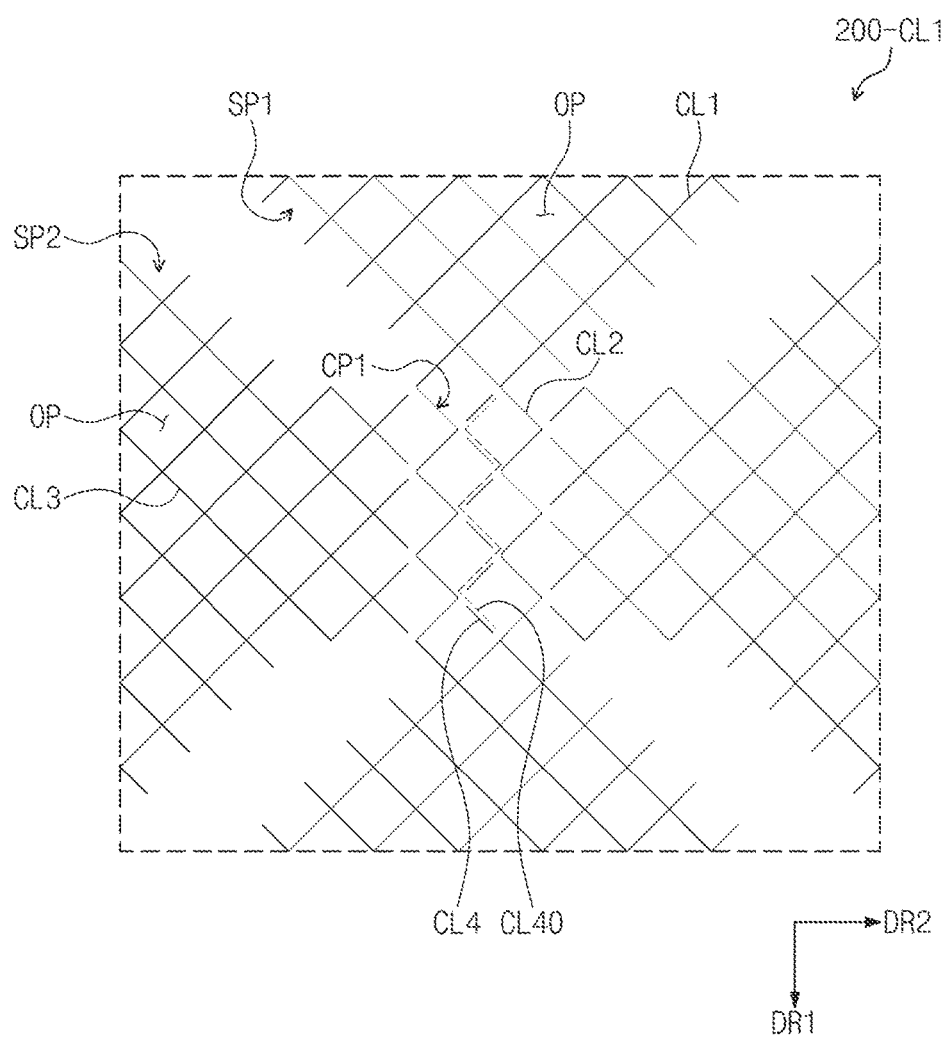
FIG. 5B is a plane diagram illustrating a first conduction layer of the touch panel of FIG. 5A.
Figure 5C:
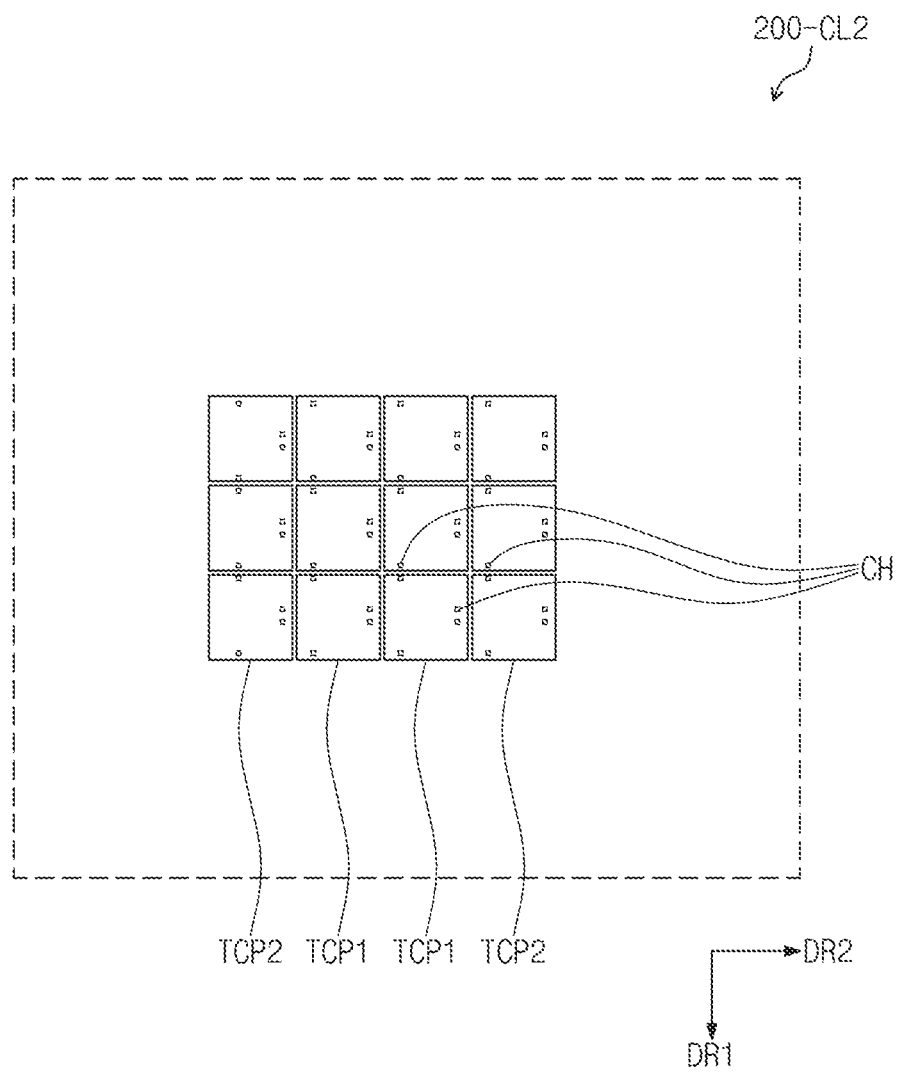
FIG. 5C is a plane diagram illustrating a second conduction layer of the touch panel of FIG. 5A.
Figure 5D:
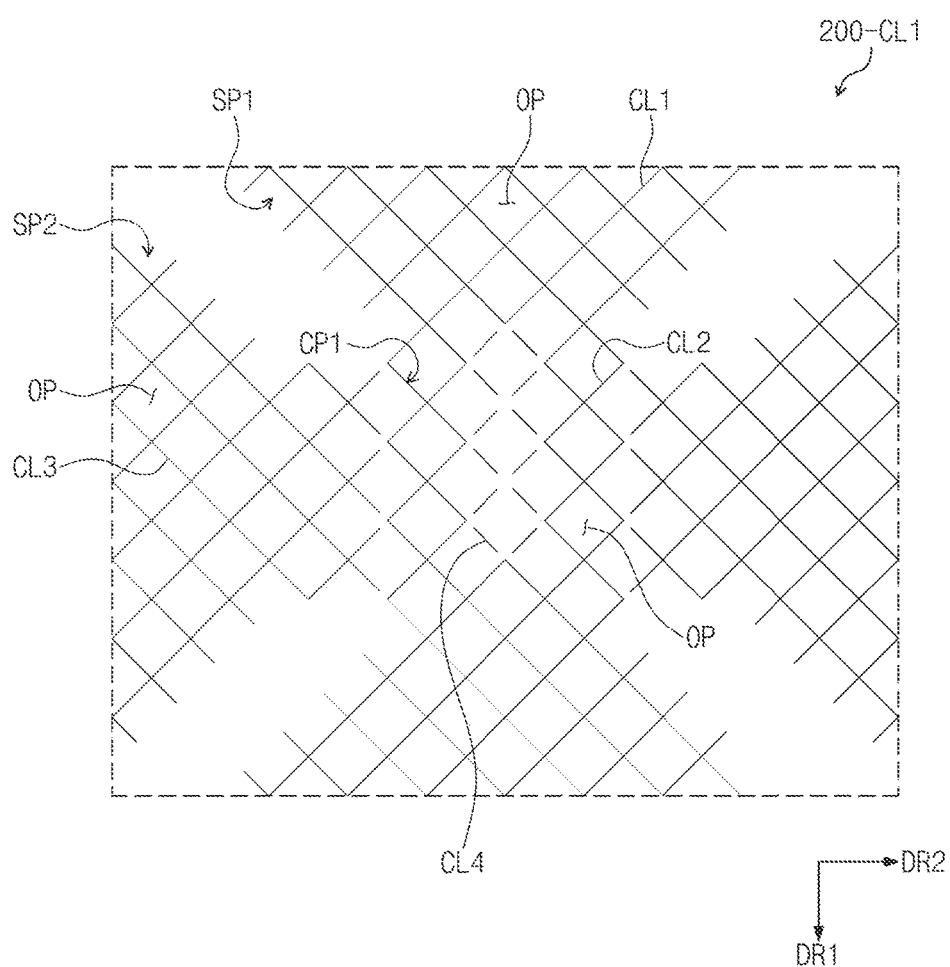
FIG. 5D is a plane diagram illustrating a first conduction layer of a touch panel according to an exemplary embodiment of the present invention.

FIG. 5A is an exploded-view diagram illustrating an area AA of FIG. 4. FIG. 5B is a plane diagram illustrating the first conduction layer 200-CL1 of the touch panel 200 of FIG. 5A. FIG. 5C is a plane diagram illustrating a second conduction layer 200-CL2 of the touch panel 200 of FIG. 5A. FIG. 5D is a plane diagram illustrating a first conduction layer 200-CL1 of a touch panel according to an exemplary embodiment of the present invention.

As shown in FIGS. 5A to 5D, the first touch sensors TS1 may include first conductive lines CL1 and second conductive lines CL2. The first conductive lines CL1 may be connected to each other to define opening parts OP. The first conductive lines CL1 may define a first sensor part SP1 having a mesh shape. Each of the first conductive lines CL1 may be one side of the opening part OP. Alternatively, each of the first conductive lines CL1 may be two or more successive sides of the opening parts OP.

The second conductive lines CL2 may define a first crossing part CP1. FIG. 5B illustrates the first crossing part CP1 including two second conductive lines CL2. The second conductive lines CL2 may be folded multiple times. Each of the second conductive lines CL2 may connect two adjacent first conductive lines CL1 to each other. The second conductive lines CL2 may be disposed along the second direction axis DR2 in isolation with each other.

As shown in FIGS. 5A to 5C, the second touch sensors TS2 may include third conductive lines CL3, fourth conductive lines CL4, and connection electrodes TCP1 and TCP2. The third conductive lines CL3 may be connected to each other and define opening parts OP. The second sensor part SP2 defined by the third conductive lines CL3 may have a mesh shape. The third conductive lines CL3 may have similar structure as the first conductive lines CL1 described above.

A second crossing part CP2 may include at least fourth conductive lines CL4 and first connection electrodes TCP1. As shown in FIG. 5B, the fourth conductive lines CL4 may be disposed between the second conductive lines CL2. The fourth conductive lines CL4 may be arranged along the first direction axis DR1. FIG. 5B illustrates six of the fourth conductive lines CL4.

The fourth conductive lines CL4 may be spaced apart with each other, unlike the first to third conductive lines CL1, CL2, and CL3. The fourth conductive lines CL4 may be surrounded by the conductive lines CL1 and CL2 of the first touch sensors TS1. From a perspective of electrically connecting the second sensor parts SP2, thus forming a bridge therebetween, each of the fourth conductive lines CL4 may be referred to as a connection line. According to an exemplary embodiment of the present invention, referring to FIG. 5B, the fourth conductive lines CL4 may be replaced with a single conductive line CL40, which is indicated by a dotted line.

Referring to FIGS. 5A to 5C, the first conductive lines CL1, the second conductive lines CL2, the third conductive lines CL3, and the fourth conductive lines CL4 may be disposed on the same base surface. The base surface may be a side of the second base member 200-BS, or a side of an insulation layer disposed on the side of the second base member 200-BS. The first conductive lines CL1, the second conductive lines CL2, the third conductive lines CL3, and the fourth conductive lines CL4 may have line widths less than 10 μm. More particularly, the first conductive lines CL1, the second conductive lines CL2, the third conductive lines CL3, and the fourth conductive lines CL4 may have line widths in a range of 0.5 μm to 5 μm.

The first conductive lines CL1, the second conductive lines CL2, the third conductive lines CL3, and the fourth conductive lines CL4 may be formed from the first conduction layer 200-CL1 illustrated with reference to FIG. 3. The first insulation layer 200-IL1 illustrated with reference to FIG. 3 may be disposed on the base surface.

As shown in FIGS. 5A to 5C, the first connection electrode TCP1 may electrically connect the third conductive lines CL3 with the fourth conductive lines CL4. The first connection electrodes TCP1 may be disposed on a different layer from the first conductive lines CL1, the second conductive lines CL2, the third conductive lines CL3, and the fourth conductive lines CL4. The first connection electrode TCP1 may connect the third conductive lines CL3 to the fourth conductive lines CL4 through contact holes CH penetrating the first insulation layer 200-IL1 illustrated with reference to FIG. 3. The first connection electrode TCP1 may be formed from the second conduction layer 200-CL2 illustrated with reference to FIG. 3.

According to the present exemplary embodiment, the first conductive lines CL1, the second conductive lines CL2, the third conductive lines CL3, and the fourth conductive lines CL4 may be metal lines each having a line width less than 10 μm, and the first connection electrode TCP1 may be a conduction pattern including a transparent conductive oxide. The first connection electrode TCP1 including the transparent conductive oxide may prevent the crossing part thereof from being seen externally.

The second crossing part CP2 may further include the second connection electrodes TCP2, which are disposed on the same layer with the first connection electrodes TCP1. The second connection electrodes TCP2 may be formed from the second conduction layer 200-CL2 illustrated with reference to FIG. 3. The second connection electrode TCP2 may connect the third conductive lines CL3 with each other through the contact holes CH, which penetrate the first insulation layer 200-IL1 illustrated with reference to FIG. 3. Additional second connection electrodes TCP2 may be disposed in the second crossing part CP2, to prevent an increase of resistance from the second sensor part SP2 to the second crossing part CP2.

As described with reference to FIGS. 5A to 5C, two adjacent second sensor parts SP2 may be electrically connected to each other through the fourth conductive lines CL4 and the first connection electrodes TCP1, to prevent the second crossing part CP2 from being damaged due to external stress, such as tensile stress or compressive stress. Accordingly, as compared to a conventional second crossing part, which includes a single bridge electrode, the second crossing part CP2 according to the present exemplary embodiment may be prevented from being cracked, even if tensile and compressive stress is applied to the second crossing part CP2, which may generate a large stress in a folding area (FA, see FIG. 2A) that may be subject to the inner or outer bending.

Referring to FIG. 5D, according to an exemplary embodiment of the present invention, the second conductive lines CL2 may be connected to each other and define opening parts OP. The first crossing part CP1 defined by the second conductive lines CL2 may have a mesh shape, which may lower a connection resistance of the first crossing part CP1.

The first conductive lines CL1, the second conductive lines CL2, the third conductive lines CL3, and the fourth conductive lines CL4 may be formed by partly opening a mesh pattern, which is disposed on the same base surface. A part of the second conductive lines CL2 of the first crossing part CP1 may be opened to form the fourth conductive lines CL4, which is isolated from the second conductive lines CL2. Conductive lines that are connected to each other may be opened to form the second conductive lines CL2 and the third conductive lines CL3. Additionally, conductive lines, which are connected to each other, may be opened to form the first conductive lines CL1 and the second conductive lines CL2.

Figure 6A:
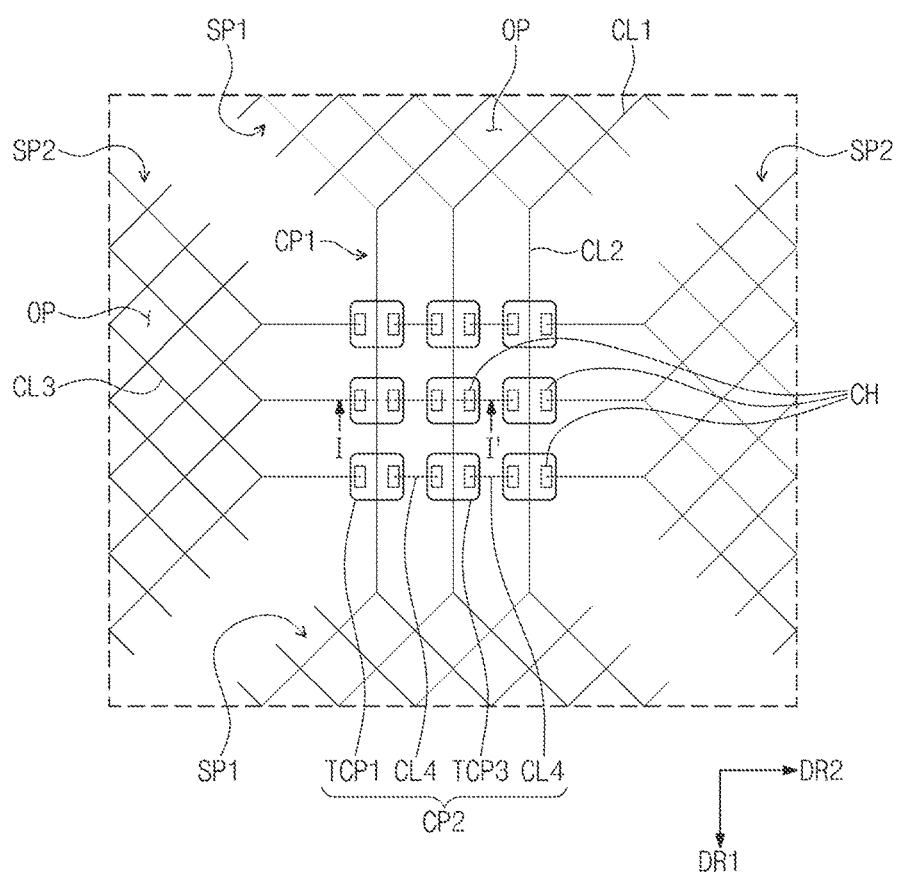
FIG. 6A is a diagram illustrating a crossing area of a touch panel according to an exemplary embodiment of the present invention.
Figure 6B:
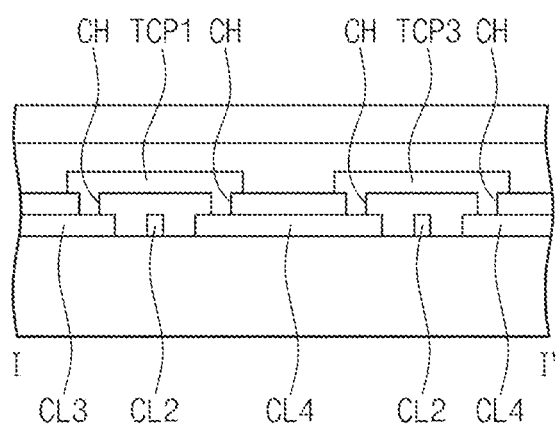
FIG. 6B is a sectional diagram taken along line I-I' of FIG. 6A.
Figure 6C:
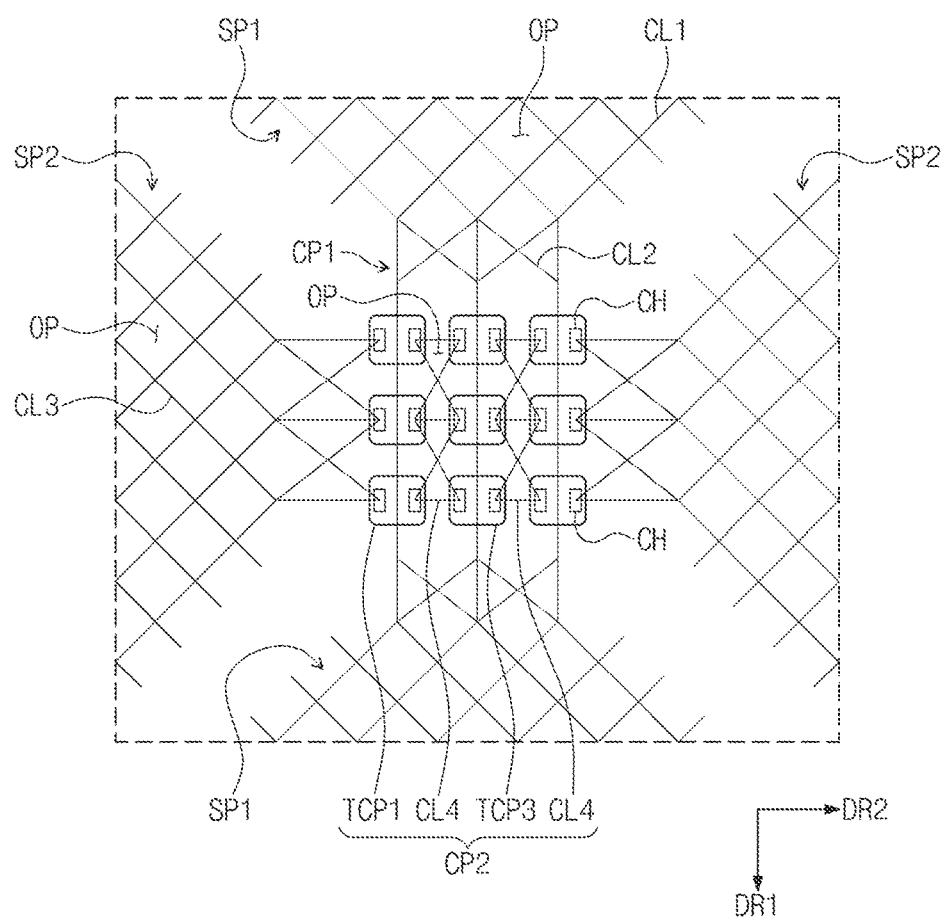
FIG. 6C is a diagram illustrating a crossing area of a touch panel according to an exemplary embodiment of the present invention.

FIG. 6A is a diagram illustrating a crossing area of a touch panel 200 according to an exemplary embodiment of the present invention. FIG. 6B is a sectional diagram taken along line I-I' of FIG. 6A. FIG. 6C is a diagram illustrating a crossing area of the touch panel 200 according to an exemplary embodiment of the present invention. FIGS. 6A to 6C illustrate a part of the touch panel 200 illustrated with reference to FIGS. 5A to 5D.

FIG. 6A illustrates three second conductive lines CL2 having a straight-line type. In FIG. 6A, the fourth conductive lines CL4 are disposed between a first and a center second conductive lines CL2, and between the center and a third second conductive lines CL2, among the first, second, and center second conductive lines CL2 of the straight-line type.

As shown FIGS. 6A and 6B, the second crossing part CP2 may further include third connection electrodes TCP3, which are disposed on the same layer with the first connection electrodes TCP1. The fourth conductive lines CL4 may be connected to each other through contact holes CH, which penetrate the first insulation layer 200-IL1 illustrated with reference to FIG. 3.

As shown in FIG. 6C, the fourth conductive lines CL4 may be connected to each other and define opening parts OP. The fourth conductive lines CL4 connected to each other may have a mesh shape, which may lower a connection resistance of the second crossing part CP2.

Figure 7:
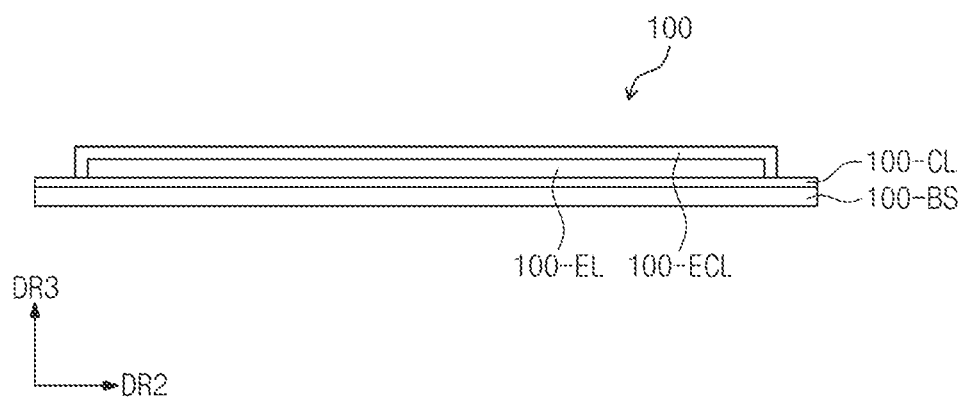
FIG. 7 is a sectional diagram illustrating a display panel according to an exemplary embodiment of the present invention.
Figure 8:
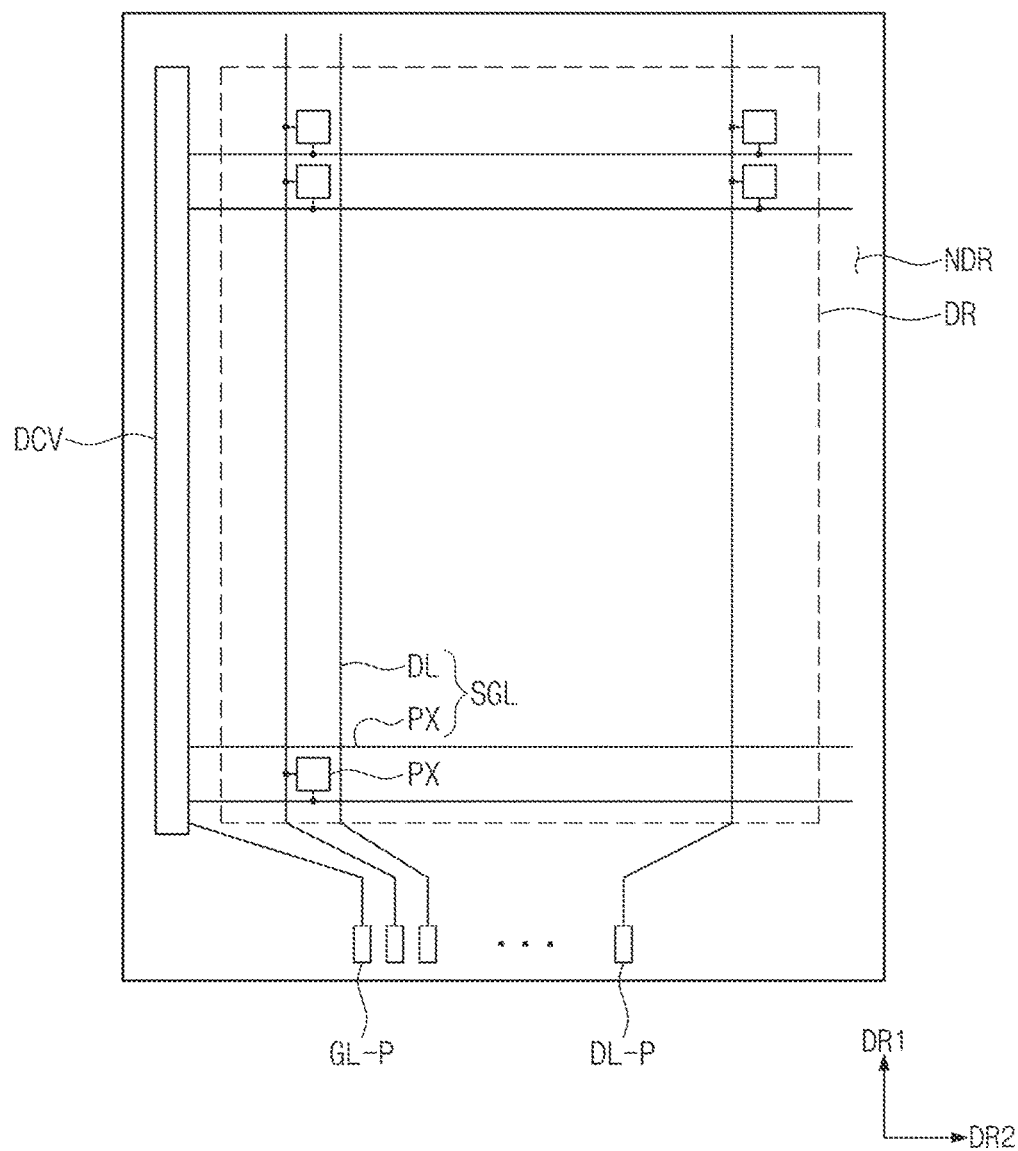
FIG. 8 is a plane diagram illustrating a display panel according to an exemplary embodiment of the present invention.
Figure 9:
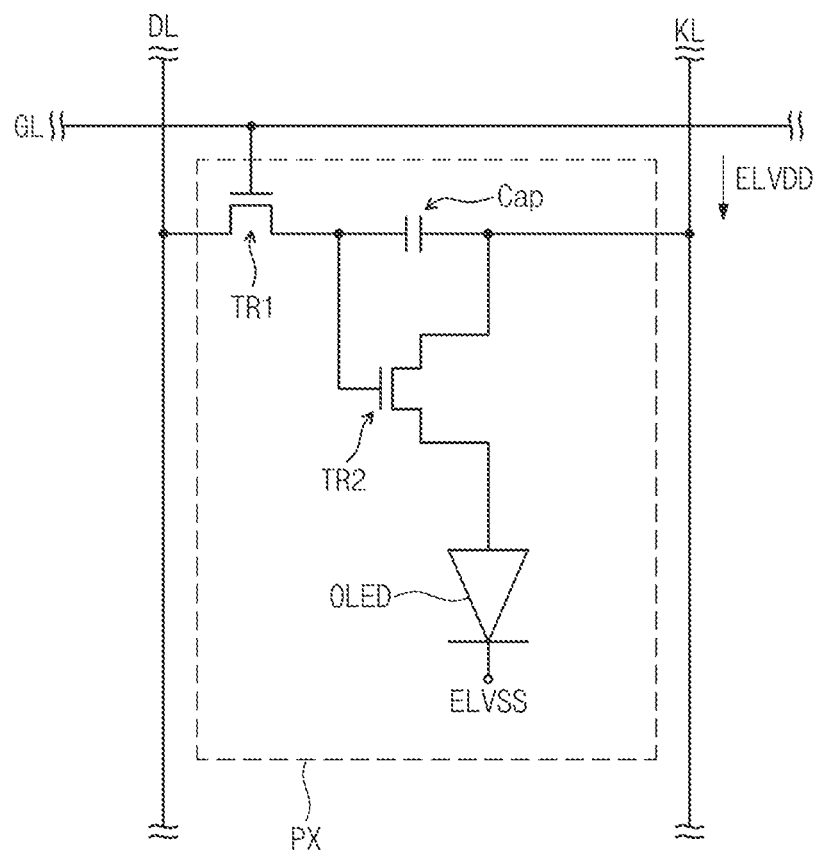
FIG. 9 is an equivalent circuit diagram illustrating a pixel according to an exemplary embodiment of the present invention.

FIG. 7 is an exploded-view sectional diagram illustrating a display panel 100. FIG. 8 is a plane diagram illustrating the display panel 100 according to an exemplary embodiment of the present invention. FIG. 9 is an equivalent circuit diagram illustrating a pixel PX according to an exemplary embodiment of the present invention. Hereinafter, the display panel 100 according to an exemplary embodiment of the present invention will be described with reference to FIGS. 7 to 9.

As shown in FIG. 7, the display panel 100 may include a first base member 100-BS, a circuit layer 100-CL, an element layer 100-EL, and an encapsulation layer 100-ECL. The display panel 100 may further include optical members (not illustrated), such as a phase retardation plate and a polarization plate, which may be disposed on the encapsulation layer 100-ECL.

The first base member 100-BS may include at least one plastic film. The first base member 100-BS may include two plastic films, inorganic films interposed between the two plastic films, and a silicon nitride film and/or a silicon oxide film. The first base member 100-BS may contain at least one of polyimide (PI), polyethyleneterephthalate (PET), polyethylenenaphthalate (PEN), polyethersulphone (PES), and fiber reinforced plastic (FRP).

The circuit layer 100-CL may include electronic elements and signal lines SGL. The circuit layer 100-CL may further include insulation layers (not illustrated) to insulate the electronic elements from the signal lines SGL.

As shown in FIGS. 8 and 9, the circuit layer 100-CL may include signal lines SGL. The signal lines SGL may include gate lines GL, which are arranged along the second direction axis DR2, and data lines DL, which are arranged along the first direction axis DR1. The gate lines GL and the data lines DL may be respectively connected with corresponding pixels PX. The circuit layer 100-CL may include circuits of the pixels PX, for example, at least one of a first thin-film transistor TR1 and a second thin-film transistor TR2, and at least one capacitor Cap. The circuit layer 100-CL may further include a gate drive circuit DCV disposed in a side of the non-display area NDA.

The gate lines GL and the data lines DL may include a gate pad part GL-P and data pad parts DL-P, which are disposed in the non-display area NDA, respectively. The gate pad part GL-P and the data pad parts DL-P may be connected to a flexible circuit board (not illustrated).

The element layer 100-EL may include display elements. As shown in FIGS. 8 and 9, the element layer 100-EL may include an organic light emitting diode (OLED) for the pixel PX. The element layer 100-EL may further include electronic elements for the OLED.

The encapsulation layer 100-ECL may encapsulate the element layer 100-EL. The element layer 100-EL may include a thin film encapsulation layer (TFE), which may include inorganic films and organic films. Alternatively, the encapsulation layer 100-ECL may be replaced with an encapsulation plate. The encapsulation plate may be isolated from the first base member 100-BS by interposing the element layer 100-EL. A sealing member may form a predetermined space along edges of the encapsulation plate and the first base member 100-BS.

A second base member (200-BS, see FIG. 3) of a touch panel 200 may be disposed on the encapsulation layer 100-ECL or the encapsulation plate. According to an exemplary embodiment of the present invention, a first conduction layer (200-CL1, see FIG. 3) of the touch panel 200 may be directly disposed on the encapsulation layer 100-ECL or the encapsulation plate.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:
1. A flexible display device, comprising:
 a display panel; and
 a touch panel comprising a first touch sensor and a second touch sensor intersecting the first touch sensor,
 wherein:
 the first touch sensor comprises:
  first sensor parts, each of the first sensor parts comprising first conductive lines; and
  a first crossing part connecting two adjacent first sensor parts, the first crossing part comprising second conductive lines; and
 the second touch sensor comprises:
  second sensor parts, each of the second sensor parts comprising third conductive lines; and
  a second crossing part comprising:
   fourth conductive lines disposed between the second conductive lines; and
   a first connection electrode connecting the third conductive lines to the fourth conductive lines and insulated from the second conductive lines.
2. The flexible display device of claim 1, wherein:
 the first conductive lines, the second conductive lines, the third conductive lines, and the fourth conductive lines are disposed directly on a first layer; and the first connection electrode is disposed on a second layer different from the first layer.

3. The flexible display device of claim 1, wherein:
the first sensor parts are disposed along a first direction axis;
the second conductive lines extend along the first direction axis; and
the second sensor parts are disposed along a second direction axis intersecting the first direction axis.

4. The flexible display device of claim 3, wherein the fourth conductive lines are spaced apart from the second conductive lines and extend along the first direction axis.

5. The flexible display device of claim 3, wherein:
the fourth conductive lines are spaced apart from the second conductive lines; and
a portion of the fourth conductive lines are disposed in the first direction axis along with one of the second conductive lines.

6. The flexible display device of claim 1, wherein the first conductive lines, the second conductive lines, the third conductive lines, and the fourth conductive lines are disposed on the same base surface.

7. The flexible display device of claim 6, wherein:
the touch panel further comprises an insulation layer disposed on the base surface and covering the first conductive lines, the second conductive lines, the third conductive lines, and the fourth conductive lines; and
the first connection electrode is disposed on the insulation layer and connects the fourth conductive lines to the third conductive lines through contact holes that penetrate the insulation layer.

8. The flexible display device of claim 7, wherein:
each of the first sensor parts has a mesh shape connecting the first conductive lines to each other; and
each of the second sensor parts has a mesh shape connecting the third conductive lines to each other.

9. The flexible display device of claim 8, wherein each of the first conductive lines and the third conductive lines have a line width less than 10 μm.

10. The flexible display device of claim 7, wherein the second crossing part further comprises a second connection electrode connecting the third conductive lines to each other, the second connection electrode disposed on the same layer with the first connection electrode.

11. The flexible display device of claim 10, wherein the second crossing part further comprises a third connection electrode connecting the fourth conductive lines to each other, the third connection electrode disposed on the same layer with the first connection electrode.

12. The flexible display device of claim 11, wherein each of the first conductive lines, the second conductive lines, and the third conductive lines comprise a transparent conductive oxide (TCO).

13. The flexible display device of claim 6, wherein:
the touch panel further comprises a base member comprising the base surface; and
the touch panel is connected to the display panel.

14. The flexible display device of claim 6, wherein the display panel comprises the base surface.

15. The flexible display device of claim 14, wherein the display panel comprises:
a base member;

a circuit layer disposed on a side of the base member;
an organic light emitting element layer disposed on the circuit layer; and
an encapsulation layer covering the organic light emitting element layer and comprising the base surface.

16. The flexible display device of claim 15, further comprising a window member disposed on the touch panel.

17. The flexible display device of claim 1, further comprising a first display area, a second display area, and a folding area disposed between the first display area and the second display area.

18. A display device, comprising:
a display panel; and
a touch panel comprising a first touch sensor and a second touch sensor crossing each other in a cross area,
wherein:
the first touch sensor comprises first conductive lines in the cross area; and
the second touch sensor comprises:
a connection line disposed between the first conductive lines in the cross area;
a second conductive line disposed outside the cross area; and
a connection electrode insulated from the first conductive lines, overlapped with the first conductive lines in the cross area, and connecting the connection line to the second conductive line.

19. The display device of claim 18, wherein:
the first conductive lines, the second conductive line, and the connection line are directly disposed on a first layer; and
the connection electrode is disposed on a second layer different from the first layer.

20. A method of forming a touch panel of a flexible display device, the method comprising:
forming a first touch sensor comprising first sensor parts and a first crossing part; and
forming a second touch sensor comprising second sensor parts and a second crossing part,
wherein:
forming the first sensor parts comprises connecting first conductive lines with each other in a mesh shape;
forming the first crossing part comprises connecting second conductive lines with each other in the mesh shape, to connect two adjacent first sensor parts;
forming the second sensor parts comprises connecting third conductive lines with each other in the mesh shape;
forming the second crossing part comprises:
partially disconnecting the second conductive lines in the mesh shape such that the disconnected second conductive lines are spaced apart from the second conductive lines in the mesh shape; and
forming a first connection electrode to connect the third conductive lines to the disconnected second conductive lines; and
the first, second, and third conductive lines are directly disposed on a first layer; and
the first connection electrode is disposed in a second layer different from the first layer.

* * * * *